(12) United States Patent
Lim et al.

(10) Patent No.: US 8,603,842 B2
(45) Date of Patent: Dec. 10, 2013

(54) METHOD OF MANUFACTURING PACKAGE SUBSTRATE FOR OPTICAL ELEMENT

(75) Inventors: Chang Hyun Lim, Seoul (KR); Seog Moon Choi, Seoul (KR); Sang Hyun Shin, Gyunggi-do (KR); Sung Keun Park, Gyunggi-do (KR); Young Ki Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 13/418,241

(22) Filed: Mar. 12, 2012

(65) Prior Publication Data

US 2012/0225508 A1   Sep. 6, 2012

Related U.S. Application Data

(62) Division of application No. 12/721,539, filed on Mar. 10, 2010, now abandoned.

(30) Foreign Application Priority Data

Dec. 16, 2009   (KR) .................. 10-2009-0125762

(51) Int. Cl.
  *H01L 33/62*   (2010.01)
(52) U.S. Cl.
  USPC .................. 438/26; 438/29; 257/E33.061
(58) Field of Classification Search
  USPC .................................. 257/E33.057
  See application file for complete search history.

(56) References Cited

U.S. PATENT DOCUMENTS

| | | | |
|---|---|---|---|
| 3,745,095 A * | 7/1973 | Chadwick et al. | 205/126 |
| 7,183,587 B2 * | 2/2007 | Negley et al. | 257/99 |
| 7,335,926 B2 * | 2/2008 | Wang et al. | 257/99 |
| 2011/0140144 A1 | 6/2011 | Lim et al. | |

FOREIGN PATENT DOCUMENTS

| | | |
|---|---|---|
| KR | 1020080041794 | 5/2008 |
| KR | 1020090072941 | 7/2009 |
| KR | 1020110068689 | 6/2011 |

OTHER PUBLICATIONS

Office Action from counterpart Korean Patent Application No. 10-2009-0125762, 4 pages, Jun. 14, 2011.

* cited by examiner

*Primary Examiner* — Stephen W Smoot
(74) *Attorney, Agent, or Firm* — Blakely, Sokoloff, Taylor & Zafman LLP (57) ABSTRACT

Disclosed is a package substrate for an optical element, which includes a base substrate, a first circuit layer formed on the base substrate and including a mounting portion, an optical element mounted on the mounting portion, one or more trenches formed into a predetermined pattern around the mounting portion by removing portions of the first circuit layer so that the first circuit layer and the optical element are electrically connected to each other, and a fluorescent resin material applied on an area defined by the trenches so as to cover the optical element, and in which such trenches are formed on the first circuit layer so that the optical element and the first circuit layer are electrically connected to each other, thus maintaining the shape of the fluorescent resin material and obviating the need to form a via under the optical element. A method of manufacturing the package substrate for an optical element is also provided.

8 Claims, 9 Drawing Sheets

FIG.1

Prior art

METHOD OF MANUFACTURING PACKAGE SUBSTRATE FOR OPTICAL ELEMENT

CROSS REFERENCE TO RELATED APPLICATIONS

This application claims the benefit of Korean Patent Application No. 10-2009-0125762, filed Dec. 16, 2009, entitled "Package substrate for optical element and manufacturing method thereof", and U.S. patent application Ser. No. 12/721,539, filed Mar. 10, 2010, now abandoned, entitled "Package substrate for optical element and method of manufacturing the same" each of which is hereby incorporated by reference in its entirety into this application.

BACKGROUND OF THE INVENTION

1. Technical Field

The present invention relates to a package substrate for an optical element and a method of manufacturing the same.

2. Description of the Related Art

Recently, light emitting diodes (LEDs) are continuously increasing in demand and are gradually receiving attention from the general illumination market, because they are environmentally friendly and achieve energy saving effects including lower power consumption, higher performance, longer operating lifespan, etc., compared to conventional optical elements such as incandescent or fluorescent lamps.

Furthermore, because such an LED may exhibit higher image quality compared to a cold cathode fluorescent lamp conventionally used as a light source of a liquid crystal display, package substrates for an optical element using the LED as a backlight unit are being introduced one after another.

The package substrate for an optical element is a substrate on which electrical components including integrated circuits, resistors or switches are soldered, and is mounted to circuits used in computers or a variety of displays.

Upon fabrication of the package substrate for an optical element, a fluorescent resin material is typically applied in order to emit white light. As such, in the case where the size or thickness of the optical element has increased, there may occur a problem in which the shape of the applied fluorescent resin material is not maintained in the form of a dome. With the goal of solving this problem, a conventional technique discloses a package substrate for an optical element in which a thickness difference is created using metal at a portion of the package substrate on which an optical element will be mounted, but the thickness difference causes other problems.

Figure 1:
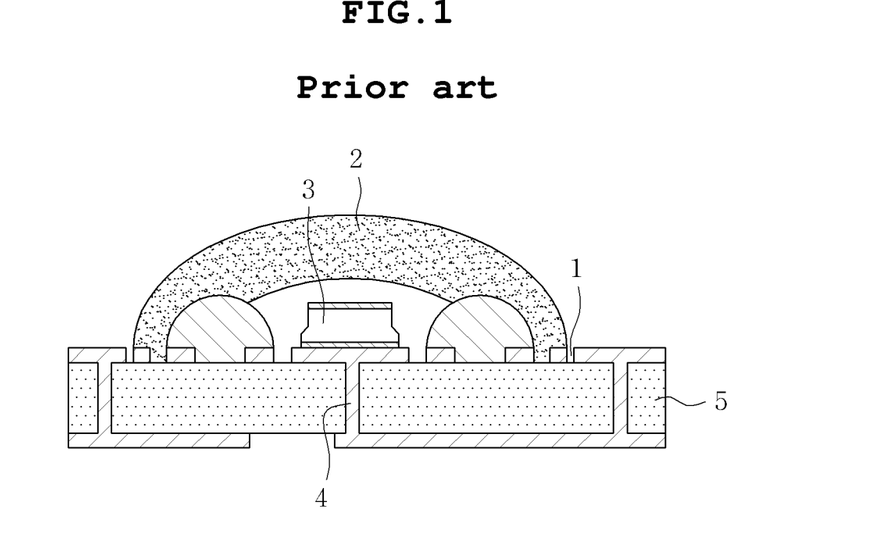
FIG. 1 is a cross-sectional view showing a package substrate for an optical element according to a conventional technique.

FIG. 1 is a cross-sectional view showing a package substrate for an optical element according to a conventional technique. With reference to this drawing, the problems of the conventional technique are described below.

As shown in FIG. 1, the dome shape of a fluorescent resin material 2 may be maintained by a thickness difference 1, but a circuit layer cannot be formed around an optical element 3 and thus a via 4 must be formed at the position of a package substrate where the optical element 3 will be mounted in order to form an electrical connection.

Thus, a plugging process for filling the empty space of the via 4 with epoxy should be additionally performed, undesirably complicating the manufacturing process. When the via 4 is filled with epoxy, voids are formed, undesirably lowering reliability of the via 4. Furthermore, heat dissipation properties of the substrate 5 for heat occurring from the optical element 3 are deteriorated due to epoxy.

Moreover, there are the problems of the optical element 3 being inclined by the via 4 upon mounting of the optical element 3 or that of a die attach adhesive for adhering the optical element 3 infiltrating the via 4 and undesirably leaking out of the opposite surface of the substrate 5.

SUMMARY OF THE INVENTION

Accordingly, the present invention has been made keeping in mind the problems encountered in the related art and the present invention is intended to provide a package substrate for an optical element, in which a trench is used so that the dome shape of a fluorescent resin material is maintained and an optical element and a first circuit layer are electrically connected to each other, thus obviating a need to form a via under the optical element, and also to provide a method of manufacturing the same.

An aspect of the present invention provides a package substrate for an optical element, including a base substrate, a first circuit layer formed on the base substrate and including a mounting portion, an optical element mounted on the mounting portion, one or more trenches formed into a predetermined pattern around the mounting portion by removing portions of the first circuit layer so that the first circuit layer and the optical element are electrically connected to each other, and a fluorescent resin material applied on an area defined by the trenches so as to cover the optical element.

In this aspect, the predetermined pattern may have a circular shape, an oval shape or a polygonal shape.

In this aspect, the trenches may be formed by removing portions of the first circuit layer using etching.

In this aspect, the base substrate may be an organic substrate or a metal substrate having an anodic oxide film formed over an entire surface of the metal substrate.

In this aspect, the base substrate may be an aluminum substrate having alumina formed over an entire surface of the aluminum substrate.

In this aspect, the package substrate may further include a second circuit layer spaced apart from the first circuit layer on the base substrate.

In this aspect, the package substrate may further include a wiring for electrically connecting the second circuit layer and the optical element to each other.

Another aspect of the present invention provides a method of manufacturing the package substrate for an optical element, including (A) forming a first circuit layer including a mounting portion on a base substrate, (B) removing portions of the first circuit layer thus forming one or more trenches into a predetermined pattern around the mounting portion so that the first circuit layer and an optical element which will be mounted on the mounting portion are electrically connected to each other, (C) mounting the optical element on the mounting portion, and (D) applying a fluorescent resin material on an area defined by the trenches so as to cover the optical element.

In this aspect, in (B) the predetermined pattern may have a circular shape, an oval shape, or a polygonal shape.

In this aspect, in (B) the trenches may be formed by removing portions of the first circuit layer using etching.

In this aspect, in (A) the base substrate may be an organic substrate.

In this aspect, the method may further include preparing as the base substrate a metal substrate having an anodic oxide film formed over an entire surface thereof, before (A).

In this aspect, the method may further include preparing as the base substrate an aluminum substrate having alumina formed over an entire surface thereof, before (A).

In this aspect, (A) may further include forming a second circuit layer spaced apart from the first circuit layer on the base substrate.

In this aspect, the method may further include electrically connecting the second circuit layer and the optical element to each other using a wiring, after (C).

In this aspect, (A) may further include forming a seed layer on the base substrate before forming the first circuit layer.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Hereinafter, embodiments of the present invention will be described in detail while referring to the accompanying drawings. Throughout the drawings, the same reference numerals are used to refer to the same or similar elements. Moreover, descriptions of known techniques, even if they are pertinent to the present invention, are regarded as unnecessary and may be omitted in so far as they would make the characteristics of the invention and the description unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Figure 2A:
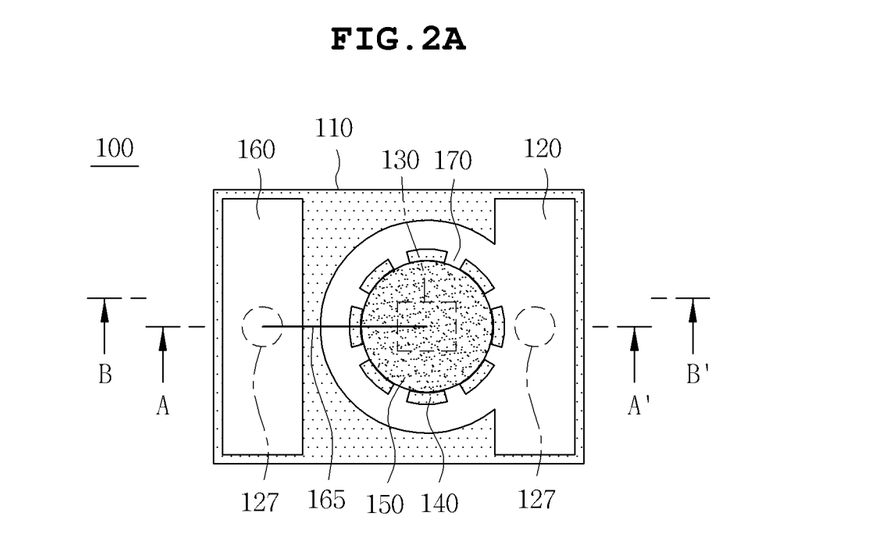
FIG. 2A is a top plan view showing a package substrate for an optical element according to an embodiment of the present invention.
Figure 2B:
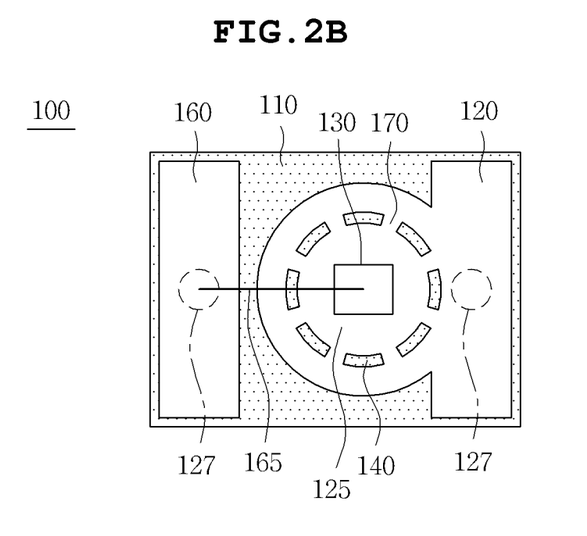
FIG. 2B is a top plan view showing the package substrate of FIG. 2A, except for a fluorescent resin material.
Figure 3:
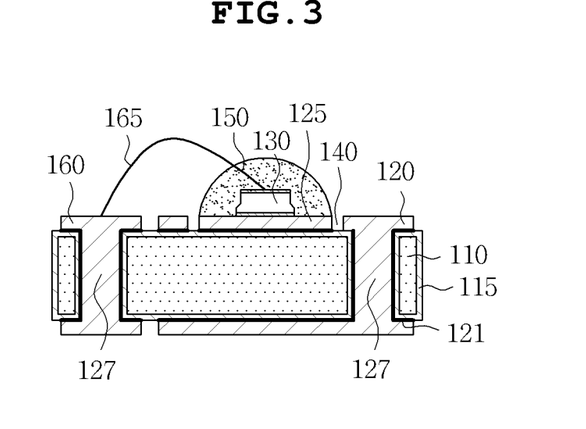
FIG. 3 is a cross-sectional view showing the package substrate taken along the line A-A' of FIG. 2.
Figure 4:
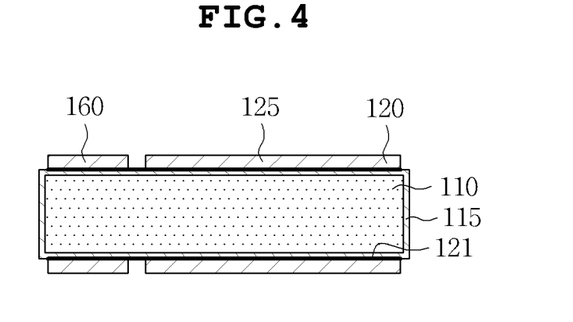
FIG. 4 is a cross-sectional view showing the package substrate taken along the line B-B' of FIG. 2.

FIG. 2A is a top plan view showing a package substrate for an optical element according to an embodiment of the present invention, and FIG. 2B is a top plan view showing the package substrate of FIG. 2A, except for a fluorescent resin material. FIG. 3 is a cross-sectional view showing the package substrate taken along the line A-A' of FIG. 2, and FIG. 4 is a cross-sectional view showing the package substrate taken along the line B-B' of FIG. 2.

As shown in FIGS. 2A, 2B, 3 and 4, the package substrate 100 for an optical element according to the present embodiment includes a base substrate 110, a first circuit layer 120 formed on the base substrate 110 and including a mounting portion 125, an optical element 130 mounted on the mounting portion 125, one or more trenches 140 formed into a predetermined pattern around the mounting portion 125 by removing portions of the first circuit layer 120 so that the first circuit layer 120 and the optical element 130 are electrically connected to each other, and a fluorescent resin material 150 applied on an area defined by the trenches 140 so as to cover the optical element 130.

The base substrate 110, which is a basic member of the package substrate 100, may include an organic substrate or a metal substrate. As such, when a metal substrate is used as the base substrate 110, in order to prevent the metal substrate from shorting out with the first circuit layer 120, the metal substrate should have an anodic oxide film 115 formed over the entire surface thereof by anodizing treatment. Particularly useful as the metal substrate is an aluminum (Al) substrate having high heat dissipation properties and including alumina ($Al_2O_3$) as the anodic oxide film 115. On the other hand, when an organic substrate is used as the base substrate 110, the organic substrate may be formed of epoxy resin such as FR-4 or BT (Bismaleimide Triazine), a prepreg, ABF (Ajinomoto Build up Film), etc., but the present invention is not limited thereto.

The first circuit layer 120, which functions to supply power to the optical element 130, is formed on the base substrate 110 and includes the mounting portion 125 on which the optical element 130 will be mounted. As such, the first circuit layer 120 may play a role as a reflective film for increasing reflectivity of light emitted from the optical element 130. The formation of the first circuit layer 120 specifically includes forming a seed layer 121 using nickel (Ni), titanium (Ti), zinc (Zn), chromium (Cr) or copper (Cu) is formed (FIG. 15), performing electroplating using the seed layer 121 as a lead wire thus forming an electroplating layer 123 (FIG. 16), and then patterning the electroplating layer 123 using an imaging process, thereby forming the first circuit layer 120 (FIG. 17).

The first circuit layer 120 may be formed on either or both surfaces of the base substrate 110. In the case where the first circuit layer 120 is formed on both surfaces of the base substrate 110, a via 127 may be formed in the base substrate 110 so that a first circuit layer 120 formed on one surface of the base substrate 110 is electrically connected to a first circuit layer 120 formed on the other surface of the base substrate 110. Unlike the conventional technique, according to the present invention, there is no need to exactly position the via under the optical element 130, and thus problems in which the optical element 130 becomes inclined by a via upon mounting of the optical element 130 or in which a die attach adhesive for adhering the optical element 130 leaks out of the opposite surface of a substrate through a via do not occur.

The optical element 130, which is exemplified by an LED, is mounted on the mounting portion 125 of the first circuit layer 120 using flip-chip bonding. Furthermore, the optical element 130 emits light using power supplied from the first circuit layer 120 directly connected thereto using flip-chip bonding and a second circuit layer 160 connected thereto using wiring 165.

Figure 5:
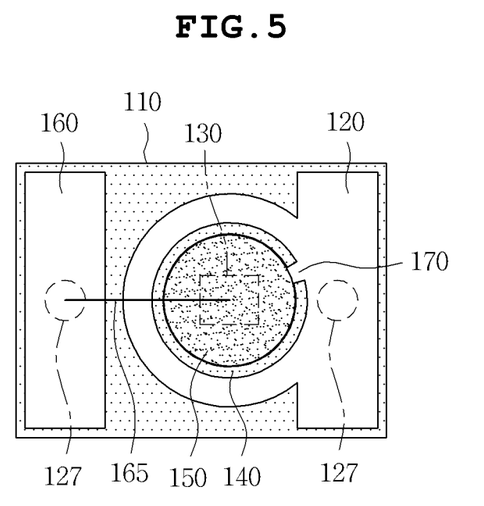
FIGS. 5 to 12 are top plan views showing various modifications of trenches of FIG. 2A.
Figure 6:
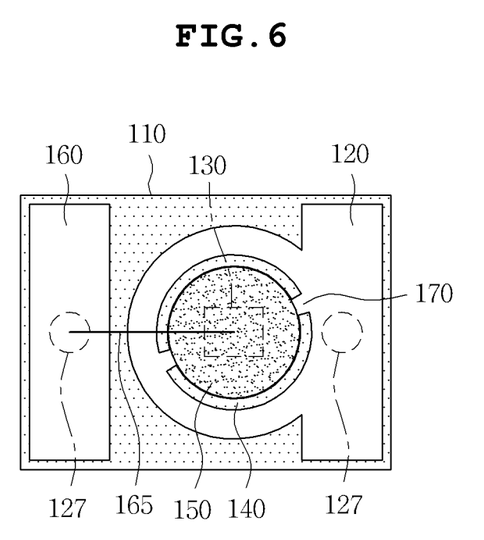
Figure 7:
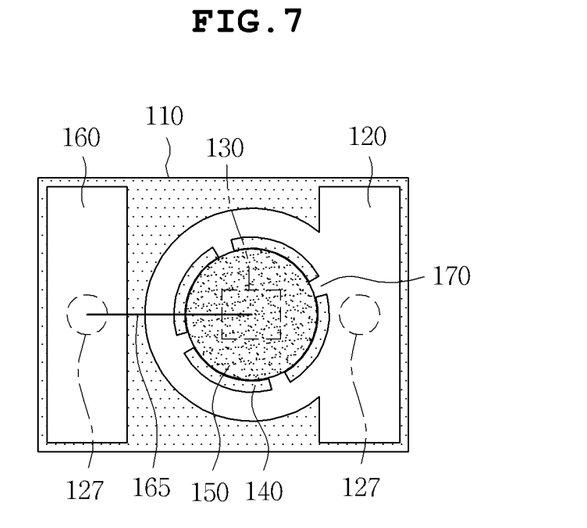
Figure 8:
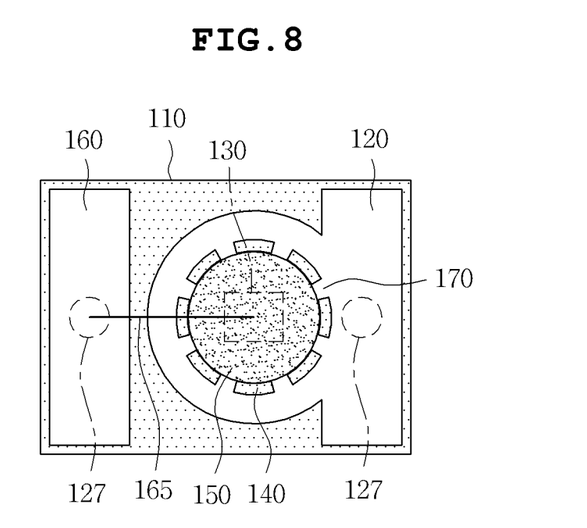
Figure 9:
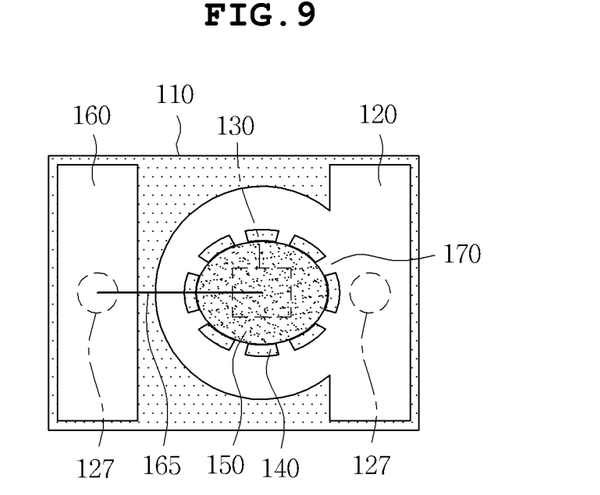
Figure 10:
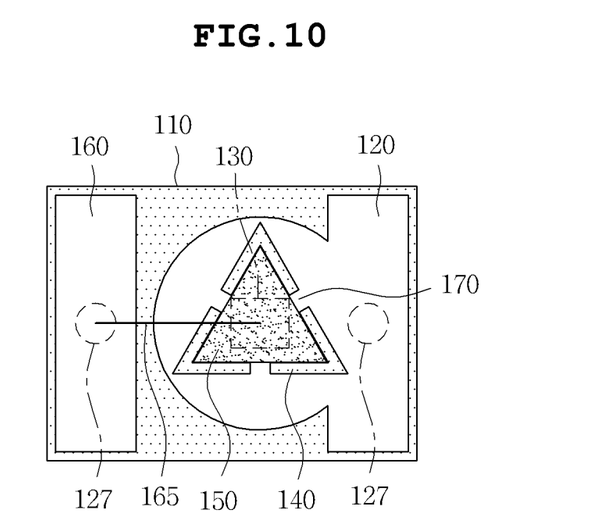
Figure 11:
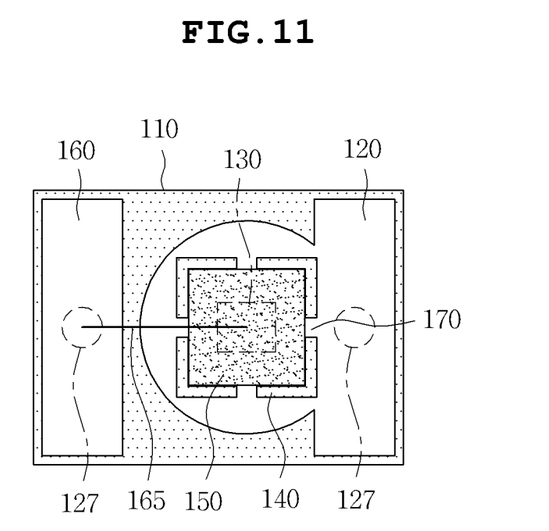
Figure 12:
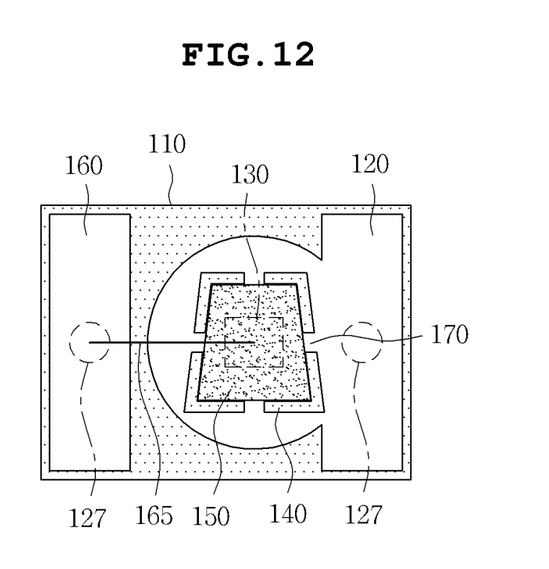

The trenches 140, which function to maintain the dome shape of the fluorescent resin material 150, are formed into a predetermined pattern around the mounting portion 125 for mounting the optical element 130 thereon by removing portions of the first circuit layer 120. Because the first circuit layer 120 should supply power to the optical element 130, the first circuit layer 120 must not be electrically isolated from the mounting portion 125 (FIG. 4). Thus, the trenches 140 should be provided not in the form of a closed curve completely surrounding the mounting portion 125 but in the form of a connection pattern 170 for electrically connecting the first circuit layer 120 and the mounting portion 125. Herein, the number and shape of the trenches 140 may be adjusted depending on the amount and viscosity of the fluorescent resin material 150. For example, the number of trenches 140 is not particularly limited, and may be set to any natural number of 1 or more, for example, 1 (FIG. 5), 2 (FIG. 6), 4 (FIG. 7), or 8 (FIG. 8). Also, the shape of the predetermined pattern of the trenches 140 around the mounting portion 125 is not particularly limited, but includes a circular shape (FIG. 2A), an oval shape (FIG. 9) or a polygonal shape including a triangular shape (FIG. 10), a rectangular shape (FIG. 11), a trapezoidal shape (FIG. 12) or the like. As such, the polygonal shape indicates a plane figure consisting of N sides ($3 \leq N < \infty$).

As the corner angle of the trenches 140 is close to 90 degrees, the dome shape of the fluorescent resin material 150 may be more effectively maintained. Thus, the trenches 140 may be formed by removing portions of the first circuit layer 120 using etching.

The fluorescent resin material 150, which functions to protect the optical element 130, is formed by dispensing liquid silicon or epoxy. Because the trenches 140 function to prevent the fluorescent resin material 150 from spreading, the dome shape of the fluorescent resin material 150 is maintained in the area defined by the trenches 140.

The package substrate 100 according to the present embodiment may further include the second circuit layer 160 for supplying power to the optical element 130, in addition to the first circuit layer 120. For example, when the first circuit layer 120 supplies negative current to the optical element 130, the second circuit layer 160 supplies positive current to the optical element 130. Thus, the second circuit layer 160 is spaced apart from the first circuit layer 120 on the base substrate 110 so as not to be electrically connected to the first circuit layer 120. As such, the second circuit layer 160 may also be formed on both surfaces of the base substrate 110 like the first circuit layer 120. In this case, a via 127 may be formed so that a second circuit layer 160 formed on one surface of the base substrate 110 is electrically connected to a second circuit layer 160 formed on the other surface thereof. Furthermore, in order to supply power to the optical element 130, the second circuit layer 160 may be connected to the optical element 130 through wire bonding using wiring 165.

In the package substrate 100 for an optical element according to the present embodiment, the portions of the first circuit layer 120 are removed thus forming the trenches 140 so that the optical element 130 and the first circuit layer 120 are electrically connected to each other. Thereby, the dome shape of the fluorescent resin material 150 may be maintained, without the need to form a via under the optical element 130.

FIGS. 13 to 20 sequentially show a process of manufacturing the package substrate for an optical element according to the embodiment of the present invention.

As shown in FIGS. 13 to 20, the method of manufacturing the package substrate for an optical element according to the present embodiment includes forming a first circuit layer 120 including a mounting portion 125 on a base substrate 110, removing portions of the first circuit layer 120 thus forming one or more trenches 140 into a predetermined pattern around the mounting portion 125 so that the first circuit layer 120 and an optical element 130 which will be mounted on the mounting portion 125 are electrically connected to each other, mounting the optical element 130 on the mounting portion 125, and applying a fluorescent resin material 150 on an area defined by the trenches 140 so as to cover the optical element 130.

Figure 13:
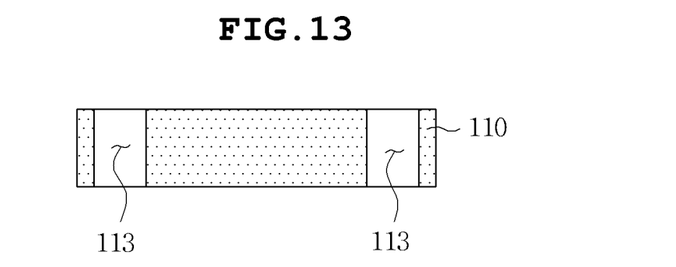
FIGS. 13 to 20 are cross-sectional views sequentially showing a process of manufacturing the package substrate for an optical element according to the embodiment of the present invention.

As shown in FIG. 13, the base substrate 110 is prepared and a through hole 113 is formed. As such, the base substrate 110 may include an organic substrate or a metal substrate. Particularly useful as the metal substrate is an Al substrate having high heat dissipation properties. The reason why the through hole 113 is formed in the base substrate 110 in the present procedure is that, when a first circuit layer 120 or a second circuit layer 160 is formed on both surfaces of the base substrate 110, the intent is to form a via 127 using a plating process in a subsequent procedure so that a first circuit layer 120 or a second circuit layer 160 formed on one surface of the base substrate 110 is connected to a first circuit layer 120 or a second circuit layer 160 formed on the other surface thereof.

Figure 14:
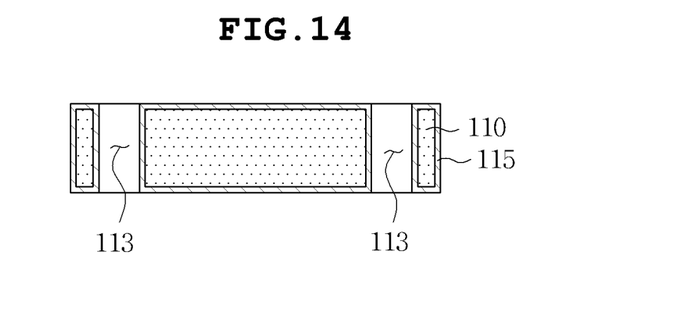

Next, as shown in FIG. 14, an anodic oxide film 115 is formed over the entire surface of the base substrate 110. As such, the anodic oxide film 115 is formed using anodizing treatment on the entire surface of the metal substrate used as the base substrate 110. In particular, an Al substrate used as the base substrate 110 may include alumina ($Al_2O_3$) using anodizing treatment. This is to prevent the metal substrate used as the base substrate 110 from shorting out with the first circuit layer 120 or the second circuit layer 160. Thus, in the case where the base substrate 110 is an organic substrate, the present procedure may be omitted.

Figure 15:
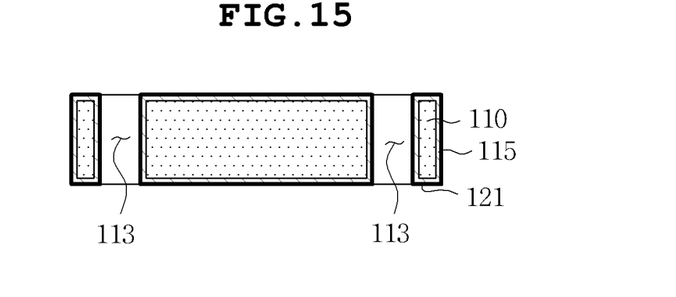
Figure 16:
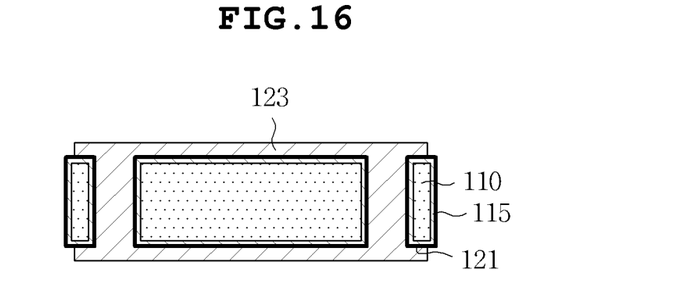
Figure 17:
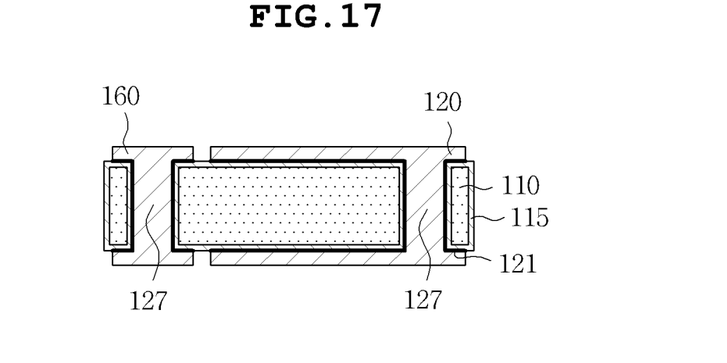

Next, as shown in FIGS. 15 to 17, the first circuit layer 120 is formed on the base substrate 110. To this end, a seed layer 121 is formed using nickel (Ni), titanium (Ti), zinc (Zn), chromium (Cr) or copper (Cu) (FIG. 15), after which electroplating is performed using the seed layer 121 as a lead wire thus forming an electroplating layer 123 (FIG. 16), which is then patterned using an imaging process thus forming the first circuit layer 120 (FIG. 17). Furthermore, in the course of patterning the electroplating layer 123 thus forming the first circuit layer 120, trenches 140 may be simultaneously formed thereby simplifying the manufacturing process. In this case, the following procedure for forming trenches 140 may be omitted.

On the other hand, when the first circuit layer 120 is formed in the present procedure, a second circuit layer 160 may also be formed. As such, the second circuit layer 160 supplies power to the optical element 130, like the first circuit layer 120. For example, when the first circuit layer 120 supplies negative current to the optical element 130, the second circuit layer 160 supplies positive current to the optical element 130. Thus, the second circuit layer 160 is spaced apart from the first circuit layer 120 so as not to be electrically connected to the first circuit layer 120.

Figure 18:
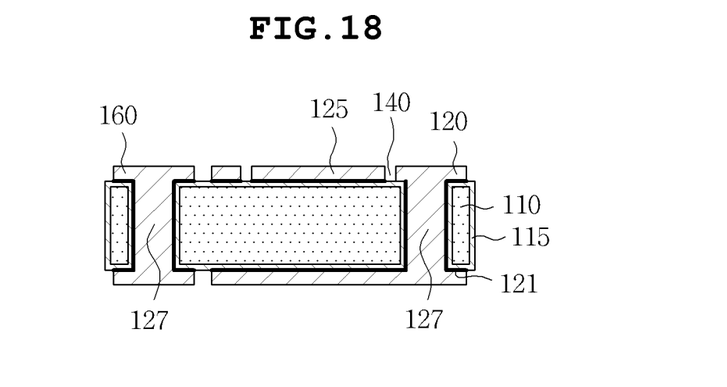

Next, as shown in FIG. 18, portions of the first circuit layer 120 are removed, thus forming trenches 140. Herein, the trenches 140 function to maintain the dome shape of a fluorescent resin material which will be applied so as to cover the optical element 130 in a subsequent procedure. Specifically, portions of the first circuit layer 120 may be removed using etching so that the trenches are formed into a predetermined pattern around the mounting portion 125. As such, in order to supply power to the optical element 130, the trenches 140 should be provided not in the form of a closed curve completely surrounding the mounting portion 125 but in the form of a connection pattern 170 (FIG. 2B) for electrically connecting the first circuit layer 120 and the mounting portion 125. Also, the number of trenches 140 is not particularly limited (FIGS. 5 to 8), and the shape of the predetermined pattern of the trenches 140 around the mounting portion 125 is not limited but may include a circular shape, an oval shape or a polygonal shape (FIGS. 9 to 12).

The present procedure may be omitted as mentioned above in the case where the trenches 140 are formed in the course of forming the first circuit layer 120.

Figure 19:
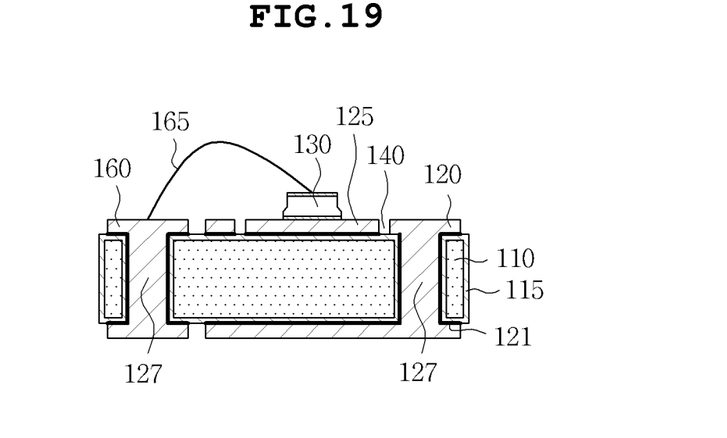

Next, as shown in FIG. 19, the optical element 130 is mounted on the mounting portion 125. The optical element 130 includes for example an LED, and is mounted on the mounting portion 125 of the first circuit layer 120 using flip-chip bonding and is also connected to the second circuit layer 160 through wire bonding using wiring 165. Specifically, the optical element 130 may be connected to the first circuit layer 120 using flip-chip bonding, and also to the second circuit layer 160 using wire bonding, so that power is supplied to the optical element 130.

Figure 20:
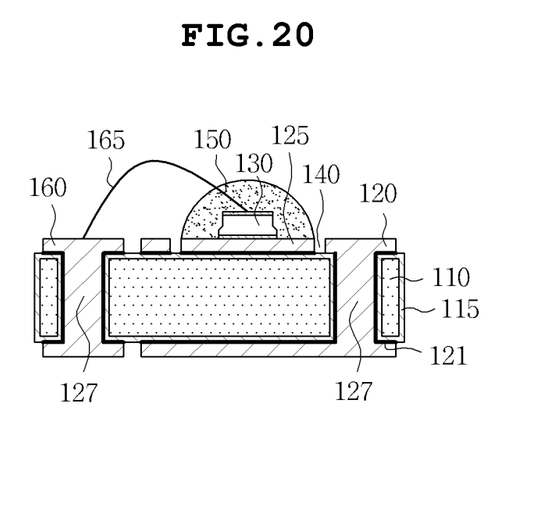

Next, as shown in FIG. 20, the fluorescent resin material 150 is applied so as to cover the optical element 130. The fluorescent resin material 150 may be dispensed, and is not spread by the trenches 140 and thus the dome shape thereof is maintained in the area defined by the trenches 140.

As described hereinbefore, the present invention provides a package substrate for an optical element and a method of manufacturing the same. According to the present invention, trenches are formed on a first circuit layer so that the optical element and the first circuit layer are electrically connected to each other, thus obviating the need to form a via under the optical element. Hence, a plugging process for filling the empty space of the via with epoxy or the like may be omitted, thus simplifying the manufacturing process of the package substrate for an optical element.

Also, according to the present invention, because the via is not provided under the optical element, the optical element is not inclined upon mounting thereof. Furthermore, problems in which a die attach adhesive leaks out of the opposite surface of the substrate through the via can be prevented in advance.

Although the embodiments of the present invention regarding the package substrate for an optical element and the method of manufacturing the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A method of manufacturing a package substrate for an optical element, comprising:
    (A) forming a first circuit layer including a mounting portion and a second circuit layer spaced apart from the first circuit layer on a base substrate;
    (B) removing portions of the first circuit layer thus forming one or more trenches inside the first circuit layer in the form of a predetermined pattern around the mounting portion so that the first circuit layer and an optical element which will be mounted on the mounting portion are electrically connected to each other;
    (C) mounting the optical element on the mounting portion; and
    (D) applying a fluorescent resin material on an area defined by the one or more trenches so as to cover the optical element.

2. The method as set forth in claim 1, wherein in (B) the predetermined pattern has a circular shape, an oval shape, or a polygonal shape.

3. The method as set forth in claim 1, wherein in (B) the one or more trenches are formed by removing portions of the first circuit layer using etching.

4. The method as set forth in claim 1, wherein in (A) the base substrate is an organic substrate.

5. The method as set forth in claim 1, further comprising preparing as the base substrate a metal substrate having an anodic oxide film formed over an entire surface thereof, before (A).

6. The method as set forth in claim 1, further comprising preparing as the base substrate an aluminum substrate having alumina formed over an entire surface thereof, before (A).

7. The method as set forth in claim 1, further comprising electrically connecting the second circuit layer and the optical element to each other using a wiring, after (C).

8. The method as set forth in claim 1, wherein (A) further comprises forming a seed layer on the base substrate before forming the first circuit layer.

* * * * *